US008792240B2

(12) United States Patent
Feng et al.

(10) Patent No.: US 8,792,240 B2
(45) Date of Patent: Jul. 29, 2014

(54) HEAT DISSIPATION DEVICE AND RADIO FREQUENCY MODULE WITH THE SAME

(75) Inventors: Taqing Feng, Shenzhen (CN); Zhijian Li, Kista (CH); Yuping Hong, Shenzhen (CN); Hongliang Chen, Shenzhen (CN); Jian Shi, Kista (CH)

(73) Assignee: Huawei Technologies Co., Ltd., Shenzhen (CN)

( * ) Notice: Subject to any disclaimer, the term of this patent is extended or adjusted under 35 U.S.C. 154(b) by 319 days.

(21) Appl. No.: 13/327,059

(22) Filed: Dec. 15, 2011

(65) Prior Publication Data

US 2012/0087090 A1 Apr. 12, 2012

Related U.S. Application Data

(63) Continuation of application No. PCT/CN2009/072318, filed on Jun. 17, 2009.

(51) Int. Cl.
*H05K 7/20* (2006.01)
*F28D 15/02* (2006.01)

(52) U.S. Cl.
CPC ........ *F28D 15/0266* (2013.01); *F28D 15/0275* (2013.01); *H05K 7/20336* (2013.01); *F28D 15/0233* (2013.01)
USPC ...... 361/700; 361/679.52; 361/703; 361/704; 361/707; 165/104.21; 165/185

(58) Field of Classification Search
USPC ............ 361/679.52, 700, 719–720; 174/15.2, 174/252; 165/104.21, 185
See application file for complete search history.

(56) References Cited

U.S. PATENT DOCUMENTS

| | | | | |
|---|---|---|---|---|
| 4,087,893 A | * | 5/1978 | Sata et al. | 29/890.032 |
| 4,293,030 A | * | 10/1981 | Rambach | 165/96 |
| 5,087,888 A | | 2/1992 | Mountz et al. | |
| 5,161,090 A | * | 11/1992 | Crawford et al. | 361/700 |
| 5,199,165 A | * | 4/1993 | Crawford et al. | 29/846 |
| 5,253,702 A | | 10/1993 | Davidson et al. | |

(Continued)

FOREIGN PATENT DOCUMENTS

| | | |
|---|---|---|
| CN | 2269639 Y | 12/1997 |
| CN | 2378706 | 5/2000 |

(Continued)

OTHER PUBLICATIONS

English-language International Search Report from the Chinese Patent Office in International Application No. PCT/CN2009/072318 mailed Mar. 25, 2010.

(Continued)

*Primary Examiner* — Robert J Hoffberg
(74) *Attorney, Agent, or Firm* — Conley Rose, P.C.; Grant Rodolph; Nicholas K. Beaulieu

(57) ABSTRACT

A heat dissipation device and a radio frequency module with the same are provided. The heat dissipation device includes a substrate (1). The substrate (1) having a surface where a heat absorbing surface (5) is formed. There are multiple hollow conduits inside the substrate (1) to act as evaporating conduits (6). The heat dissipation device further comprises condensing conduits (7) intercommunicated with the evaporating conduits (6). The evaporating conduits (6) and the condensing conduits (7) form sealed conduits. The sealed conduits are filled with liquid which vaporizes upon heating. At least the evaporating conduits (6) are set in the substrate (1).

15 Claims, 10 Drawing Sheets

(56) References Cited

U.S. PATENT DOCUMENTS

| | | | |
|---|---|---|---|
| 6,102,110 A | 8/2000 | Julien et al. | |
| 6,163,073 A | 12/2000 | Patel | |
| 6,269,865 B1 | 8/2001 | Huang | |
| 6,382,309 B1 * | 5/2002 | Kroliczek et al. | 165/104.26 |
| 6,437,981 B1 * | 8/2002 | Newton et al. | 361/700 |
| 6,450,132 B1 * | 9/2002 | Yao et al. | 122/366 |
| 6,452,798 B1 * | 9/2002 | Smith et al. | 361/699 |
| 6,473,963 B1 * | 11/2002 | Goenka et al. | 29/830 |
| 6,490,159 B1 * | 12/2002 | Goenka et al. | 361/700 |
| 7,110,258 B2 * | 9/2006 | Ding et al. | 361/699 |
| 7,119,284 B2 * | 10/2006 | Bel et al. | 174/252 |
| 7,176,382 B1 * | 2/2007 | Shi et al. | 174/254 |
| 7,215,547 B2 * | 5/2007 | Chang et al. | 361/701 |
| 7,342,788 B2 * | 3/2008 | Nikfar | 361/700 |
| 7,360,903 B2 * | 4/2008 | Yamada | 353/54 |
| 7,751,190 B2 * | 7/2010 | Fujiwara | 361/700 |
| 7,921,663 B2 * | 4/2011 | Ueno et al. | 62/259.2 |
| 8,162,036 B2 * | 4/2012 | Hsiao et al. | 165/104.21 |
| 8,453,718 B2 * | 6/2013 | Lee et al. | 165/104.26 |
| 8,549,749 B2 * | 10/2013 | Zimbeck et al. | 29/890.032 |
| 2005/0056036 A1 | 3/2005 | O'Baid et al. | |
| 2006/0137859 A1 * | 6/2006 | Lin | 165/104.26 |
| 2006/0157227 A1 * | 7/2006 | Choi et al. | 165/104.21 |
| 2007/0187069 A1 * | 8/2007 | Ueno et al. | 165/80.3 |
| 2007/0188994 A1 | 8/2007 | Tsai | |
| 2008/0078531 A1 | 4/2008 | Chung et al. | |
| 2010/0044014 A1 * | 2/2010 | Ho | 165/104.26 |
| 2012/0063092 A1 * | 3/2012 | Lee | 361/700 |

FOREIGN PATENT DOCUMENTS

| | | |
|---|---|---|
| CN | 1845322 | 10/2006 |
| CN | 101142459 | 3/2008 |
| CN | 101270961 | 9/2008 |
| GB | 2 039 416 A | 8/1980 |
| JP | 58-77278 | 5/1983 |
| JP | 11 037678 A | 2/1999 |
| JP | 2005-201539 | 7/2005 |
| JP | 2008 286428 A | 11/2008 |

OTHER PUBLICATIONS

Foreign Communication From a Counterpart Application, European Application 09845988.6, European Office Action dated Feb. 27, 2013, 14 pages.

Foreign Communication From a Counterpart Application, Chinese Application No. 200980156438.6, Partial English Translation of Chinese Office Action dated May 2, 2013, 15 pages.

Chinese First Office Action mailed Jun. 7, 2012, issued in related Chinese Application No. 200980156438.6, Huawei Technologies Co., Ltd. et al. (18 pages).

Foreign Communication from a Counterpart Application, European application 09845988.6, Office Action dated Sep. 3, 2012, 6 pages.

Foreign Communication From a Related Counterpart Application, European Application No. 09845988.6, Supplementary European Search Report dated Mar. 7, 2012, 9 pages.

* cited by examiner

US 8,792,240 B2

HEAT DISSIPATION DEVICE AND RADIO FREQUENCY MODULE WITH THE SAME

CROSS-REFERENCE TO RELATED APPLICATIONS

This application is a continuation of International Application No. PCT/CN2009/072318, filed on Jun. 17, 2009, which is hereby incorporated by reference in its entirety.

FIELD OF THE INVENTION

The embodiments of the present disclosure relate to heat dissipation technology, and particularly, to a heat dissipation device and a radio frequency module with the same.

BACKGROUND OF THE INVENTION

The communication device has electronic elements and generally needs to be cooled by means of heat dissipation. Some outdoor communication devices usually are cooled by a manner of natural heat dissipation, for example, a Remote Radio Unit (RRU) is a communication device being cooled by the manner of natural heat dissipation.

The natural heat dissipation for the current communication device is mainly implemented by setting heat dissipation fins on a substrate. FIG. 1 is a front view of a structure of a communication device in the prior art, and FIG. 2 is a partially back-sectional view of the structure of the communication device as illustrated in FIG. 1. As illustrated in FIG. 1, heat dissipation fins 2 are formed on one side surface of a substrate 1, and an outer cover 3 is fastened on the other side surface of the substrate 1, so as to form an integral chamber together with the substrate 1. A functional module (i.e., a heating element) of the communication device may be placed in the chamber. On the other side surface of the substrate 1, a region, where one or more heating elements are attached, corresponds to one or more heat absorbing surfaces 5. In actual applications, in order to reduce thermal spreading resistance when the heating elements conduct heat from the heat absorbing faces 5 to the whole substrate 1, a heat pipe 10 assembly may be added to assist heat dissipation. As illustrated in FIG. 1, the communication device has the heat pipe 10 provided on an outer side of the substrate 1 to assist heat dissipation. The heat pipe 10 is disposed on one side of the substrate 1, and the heat absorbing surface 5 is on the other side of the substrate 1.

However, during the research of the present disclosure, the inventors find that the general heat dissipation device has the following defect: the above mentioned external heat pipe additionally increases the thermal contact resistance among the heat pipe, the heat dissipation fin assembly and the entire substrate, so that it is difficult to improve the heat dissipation efficiency of the heat dissipation device.

SUMMARY OF THE INVENTION

The embodiments of the present disclosure provide a heat dissipation device and a radio frequency (RF) module with the same, so as to improve the heat dissipation efficiency of the heat dissipation device.

The embodiments of the present disclosure provide a heat dissipation device, including a substrate, the substrate having a surface where a heat absorbing surface is formed, wherein a plurality of hollow conduits are opened inside the substrate, the conduits form evaporating conduits; the heat dissipation device further including:

condensing conduits communicated with the evaporating conduit, the condensing conduits and the evaporating conduits form a sealed conduit, and the sealed conduit is filled with liquid which vaporizes upon heating.

The embodiments of the present disclosure also provide an RF module with a heat dissipation device, including a substrate, the substrate having a surface where a heat absorbing surface is formed, the heat absorbing surface having a functional module of the RF module attached thereon, wherein a plurality of hollow conduits are opened inside the substrate to form evaporating conduits; the RF module with the heat dissipation device further including:

condensing conduits communicated with the evaporating conduits, the condensing conduits and the evaporating conduits forming a sealed conduit, and the sealed conduit being filled with liquid which vaporizes upon heating;

the liquid in the evaporating conduits of the sealed conduit being vaporized from the heat absorbing surface by absorbing heat dissipated from the functional modules of the RF module to form vapor, and the vapor being transferred to the condensing conduits and condensing into liquid, which flows back to the evaporating conduits.

As can be seen from the foregoing technical solutions, the evaporating conduits being formed inside the substrate can reduce the thermal contact resistance between the evaporating conduits and the heat absorbing surface, and can effectively conduct the heat dissipated by the heating elements toward the substrate and the condensing conduits, and thus the heat dissipation effect effectively improves.

DETAILED DESCRIPTION OF THE EMBODIMENTS

The present disclosure is further described in detail as follows through the embodiments accompanying by the drawings.

The First Embodiment

Figure 1:
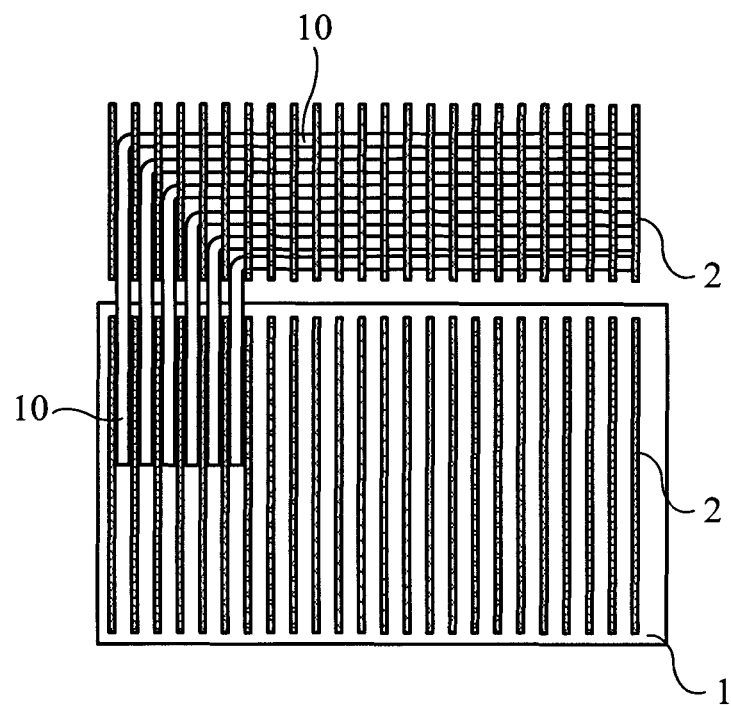
FIG. 1 is a front view of a structure of a communication device in the related art.
Figure 2:
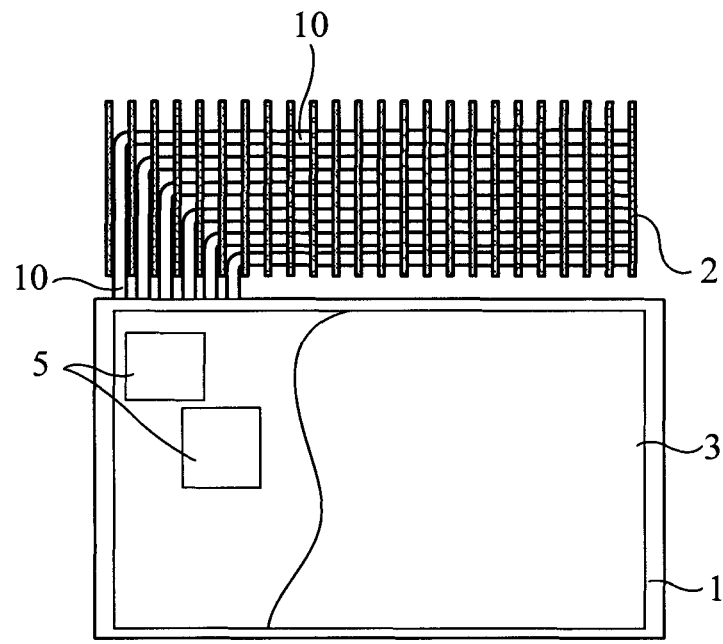
FIG. 2 is a partially back-sectional view of a structure of the communication device as illustrated in FIG. 1.
Figure 3:
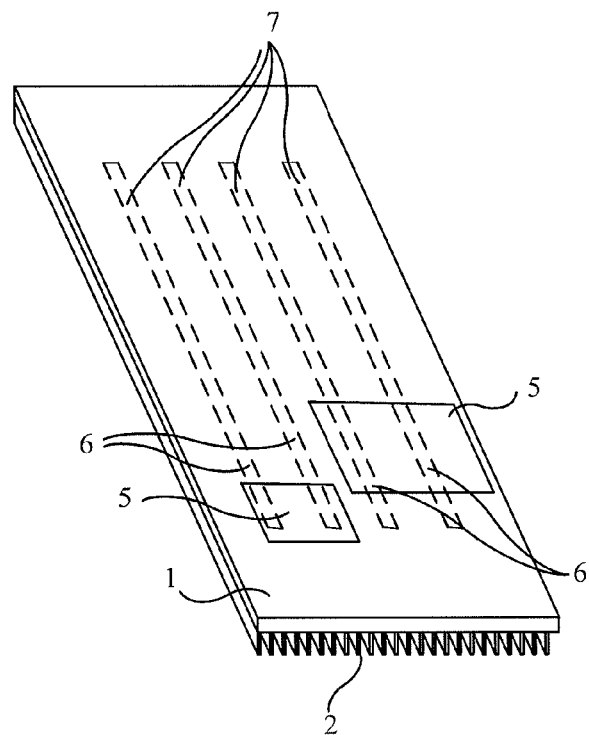
FIG. 3 is a partially section view of a structure of a heat dissipation device according to a first embodiment of the present disclosure.

FIG. 3 is a partially section view of a structure of a heat dissipation device according to a first embodiment of the present disclosure. The heat dissipation device according to this embodiment includes a substrate 1, evaporating conduits 6 and condensing conduits 7. The substrate 1 has a surface where one or more heat absorbing surfaces 5 are formed for the attaching or mounting of heating elements, such as various functional modules in the RF module. There are multiple hollow conduits opened inside the substrate 1 to form the evaporating conduits 6. The condensing conduits 7 are communicating with the evaporating conduits 6. The condensing conduits 7 and the evaporating conduits 6 form sealed conduits which are filled with liquid which vaporizes upon heating.

When the heat dissipation device works, heating elements are attached to the heat absorbing surfaces 5, and the evaporating conduits 6 are closer to the heat absorbing faces 5 than the condensing conduits 7, as such, it is more easily for the evaporating conduits 6 to absorb from the heat absorbing faces 5 the heat irradiated by the heating elements. The liquid absorbs heat and vaporizes in the evaporating conduits 6 to form vapor, and the vapor is conducted to the condensing conduits 7. Since the condensing conduits 7 are further away from the heat absorbing faces 5 than the evaporating conduits 6, a temperature difference occurs between the condensing conduits 7 and evaporating conduits 6. The vapor dissipates heat in the condensing conduits 7 and is condensed into liquid, which flows back to the evaporating conduits 6. In accordance with the above process, the liquid undergoes a phase transition circulation to conduct and dissipate heat.

In which, the sealed conduits are brought to predetermined and desired degree of vacuum.

With respect to the heat dissipation device according to the exemplary embodiment of the present disclosure, at least the evaporating conduits 6 are formed in the substrate 1, and the evaporating conduits 6 may be formed adjacent to the heat absorbing surfaces 5. In this way, heat irradiated by the heating elements can be effectively conducted into the condensing conduits 7, thus the thermal spreading resistance is small and a good heat dissipation effect can be ensured.

Further, since the evaporating conduits 6 are formed in the substrate 1, the limitation from the dimensions of the substrate 1 for the shape and size of the evaporation conduits 6 is small and particularly, the limitation from the dimensions of miniaturized RF module and its cavity for the shape and size of the evaporation conduits 6 is small. Thus, the impact on the liquid vaporization in the evaporating conduits 6 diminishes, and the cyclic heat conduction function of the evaporating conduits 6 and the condensing conduits 7 can be sufficiently exerted, thereby improving the heat dissipation efficiency.

Meanwhile, the substrate 1 is a hollow plate with a cavity, thus a weight of the heat dissipation device is reduced, and a whole volume of the heat dissipation device and the RF module using the same needs not to be increased. This meets the development requirement of miniaturization and lightweight of the RF module.

In this embodiment, the heat absorbing faces 5 may be disposed on one or two side surfaces of the substrate 1. When the heat dissipation device is exemplarily applied to the RF module such as RRU, the heat absorbing faces 5 are usually formed on a side surface of the substrate 1 and to which the functional modules of the RF module are attached. The heat absorbing faces 5 may be concave or convex surfaces, or a region set on the surface of the substrate 1.

The liquid in this embodiment may be a liquid such as ammonia, water or acetone, which easily undergoes phase transitions of vaporization and condensation.

The evaporating conduits 6 are opened in the substrate 1, and preferably integrally formed on the substrate 1. The evaporating conduits 6 are channels opened in the substrate 1. That is, hollow conduits are opened in the substrate 1 to form the evaporating conduits 6. This may save the material and procedure. The substrate 1 may be made of metal such as aluminum, magnesium or copper, or an alloy thereof.

The condensing conduits 7 are communicated with the evaporating conduits 6, and the positions thereof are not limited to the inside of the substrate 1 as illustrated in FIG. 3. The condensing conduits 7 may also be opened outside the substrate 1. The condensing conduits 7 and the evaporating conduits 6 may be formed integrally or individually. The specific embodiment is described in the following embodiments.

In which, the specific position relationships between the evaporating conduits 6 and the condensing conduits 7 are dependent on the working status of the evaporating conduits 6 and the condensing conduits 7. A portion of the conduits that more easily absorb heat from the heat absorbing faces 5 and cause liquid vaporization may act as the evaporating conduits 6, and a portion of the conduits that more easily cause vapor dissipation and condensation may act as the condensing conduits 7. Generally, the conduits closer to the heat absorbing faces 5 may act as the evaporating conduits 6, and the conduits further away from the heat absorbing faces 5 than the evaporating conduits 6 may act as the condensing conduits 7.

In specific applications, the evaporating conduits 6 and the condensing conduits 7 can be a part of the heat pipe. Capillary structures may be disposed in the evaporating conduits 6 to serve as wicks. When the vapor dissipates heat and condenses into liquid in the condensing conduits 7, the liquid, following the guiding of the wicks, may return to the evaporating conduits 6 to complete a circulation. In this solution, the relative positions of the evaporating conduits 6 and the condensing conduits 7 may not be limited. The evaporating conduits 6 may be adjacent to the heat absorbing surface 5, and the condensing conduits 7 may be far away from the heat absorbing surface 5.

The Second Embodiment

Figure 4:
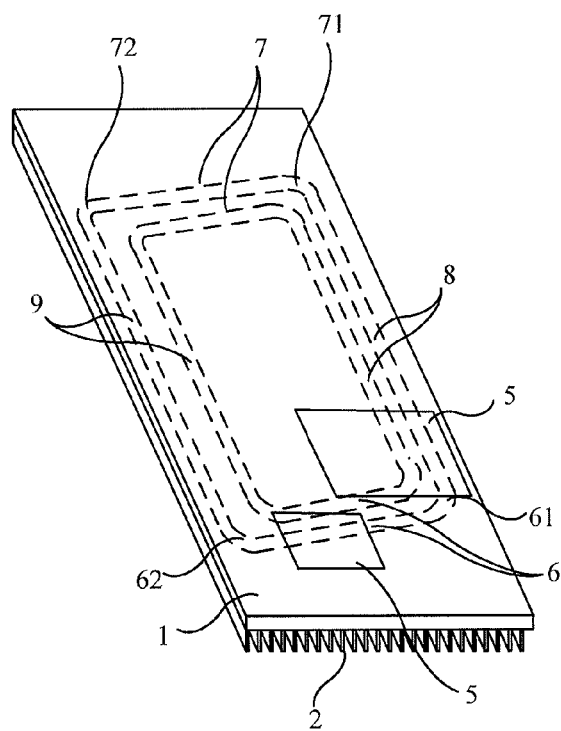
FIG. 4 is a schematic structure view of a heat dissipation device according to a second embodiment of the present disclosure.

FIG. 4 is a schematic structure view of a heat dissipation device according to a second embodiment of the present disclosure. This embodiment further specifies the positional relationships between the evaporating conduits 6 and the condensing conduits 7. Each of the evaporating conduits 6 includes a vapor outlet 61 and a liquid inlet 62. Each of the condensing conduits 7 includes a vapor inlet 71 and a liquid outlet 72. A vapor manifold 8 is intercommunicated with the vapor outlet 61 and the vapor inlet 71. A liquid manifold 9 is intercommunicated with the liquid inlet 62 and the liquid outlet 72.

In which, along an upward direction along the line of gravitational effect, the vapor inlet 71 is not lower than the vapor outlet 61 in position, and the liquid inlet 62 is not higher than the liquid outlet 72 in position.

Preferably, the vapor inlet 71 is higher than the vapor outlet 61 in position, and the liquid inlet 62 is lower than the liquid outlet 72 in position.

When the heat dissipation device works, the liquid is vaporized in the evaporating conduits 6 by absorbing heat to form vapor. The vapor flows to the condensing conduits 7 through the vapor manifold 8, and then it is liquefied therein by dissipating heat to form liquid. Next, the liquid flows back to the evaporating conduits 6 through the liquid manifold 9 to complete a circulation. The above process realizes a unidirectional circulation of the liquid in the conduits, and may avoid a convection conflict between the vapor and the liquid, and thus the heat conduction efficiency can be improved. The above technical solution can guide the liquid flow direction by disposing a wick structure in the condensing conduits 7.

Preferably, along the gravitational direction, the vapor outlet 61 is higher than the liquid inlet 62 in position, the vapor inlet 71 is higher than the liquid outlet 72 in position, the vapor outlet 61 is not higher than the vapor inlet 71 in position and the liquid inlet 62 is not higher than the liquid outlet 72 in position.

In the above technical solution, the vapor manifold 8 and the liquid manifold 9 are intercommunicated with the evaporating conduits 6 and the condensing conduits 7. In addition, along the gravitational direction, the inlets and outlets of the vapor and the liquid are disposed in a certain positional relations. In the specific operation, the liquid is firstly evaporated in the evaporating conduits 6 by absorbing heat. Since the vapor outlet 61 is higher than the liquid inlet 62 along the gravitational direction, the vapor of small density flows from the vapor outlet 61 into the vapor manifold 8, and then enters the condensing conduits 7 through the vapor manifold 8 where the vapor is to be condensed into liquid. Since the vapor inlet 71 is higher than the liquid outlet 72, the liquid flows from the liquid outlet 72 into the liquid manifold 9 under the effect of the gravity, then flows into the liquid inlet 62 along the liquid manifold 9 and finally enters the evaporating conduits 6. During the above process, the phase transition circulation of vapor rising and liquid dropping is realized under the effect of gravity, and the heat conduction and diffusion are completed.

This solution does not need to dispose structures such as wicks in the evaporating conduits 6, and is particularly suitable to the case of disposing the evaporating conduits 6 inside the substrate 1. Most of the current substrates 1 are made of aluminum and are formed through die-casting or extrusion. The evaporating conduits 6 are preferably channels integrally formed inside the substrate 1. There are some difficulties in process to form a wick with a capillary structure by sintering in the integrally formed channels. Thus, the above solution can reduce the process difficulty and the product cost by realizing the phase transition circulation of the liquid through the relative positional relations.

The liquid in this embodiment is preferably ammonia, water or acetone, which easily undergoes phase transitions of vaporization and condensation, and easily realizes vapor rising and liquid dropping under the effect of gravity.

In specific applications, the evaporating conduits 6 and the condensing conduits 7, as well as the vapor manifold 8 and the liquid manifold 9 can be opened in various manners, which will be further described in detail in the following embodiments.

The Third Embodiment

Figure 5:
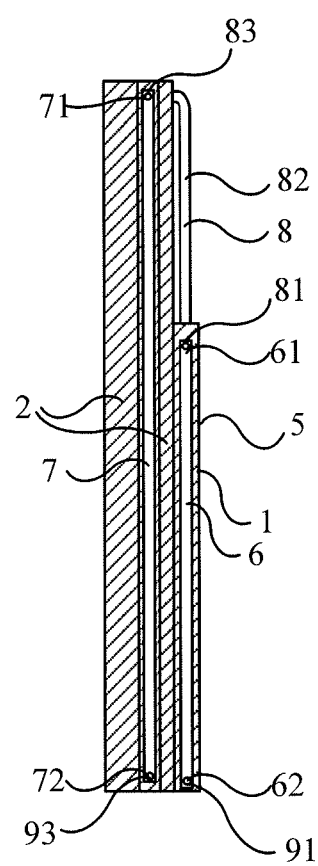
FIG. 5 is a side-sectional schematic structure view of a heat dissipation device according to a third embodiment of the present disclosure.
Figure 6:
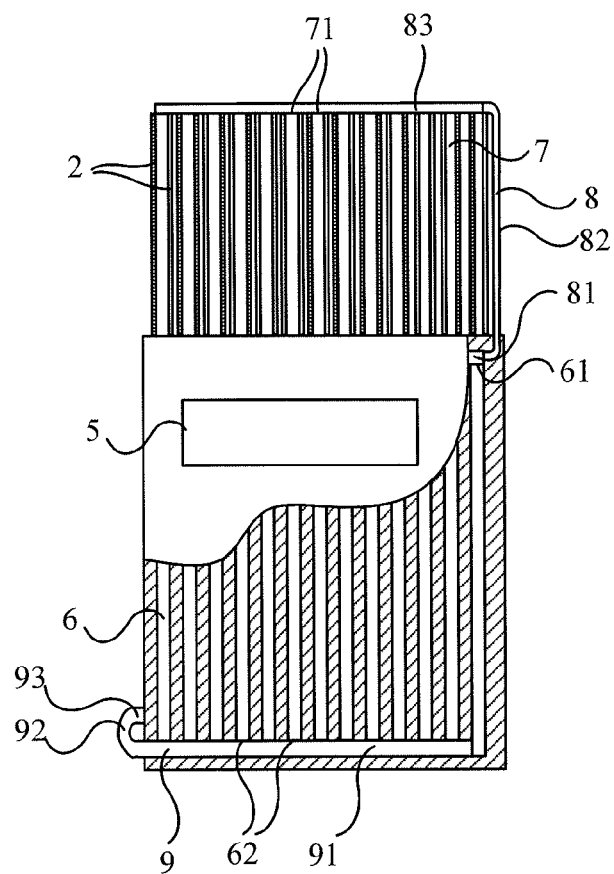
FIG. 6 is a partially section view of a structure of the heat dissipation device as illustrated in FIG. 5.
Figure 7:
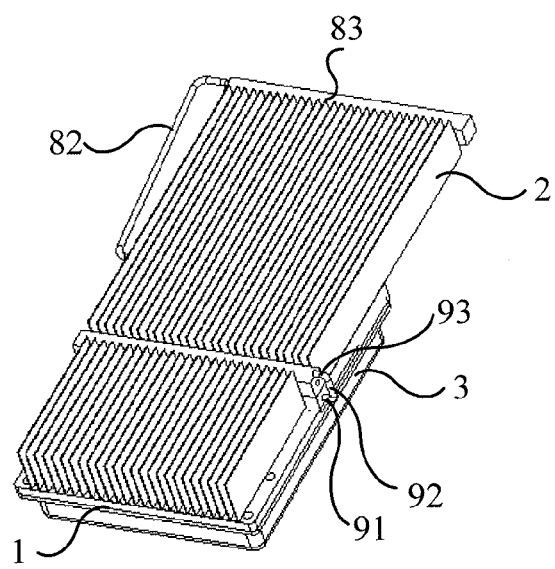
FIG. 7 is an axial side schematic structure view of the heat dissipation device as illustrated in FIG. 5.

FIG. 5 is a side-sectional schematic structure view of a heat dissipation device according to a third embodiment of the present disclosure, FIG. 6 is a partially section view of a structure of the heat dissipation device as illustrated in FIG. 5, and FIG. 7 is an axial side schematic structure view of the heat dissipation device as illustrated in FIG. 5. In this embodiment, the heat dissipation device includes a substrate 1 having a surface thereof formed with a heat absorbing surface 5. In the substrate 1, there are multiple hollow conduits serving as the evaporating conduits 6. The condensing conduits 7 are communicated to the evaporating conduits 6 to together form sealed conduits filled with liquid which vaporizes upon heating. The condensing conduits 7 are formed on the outside of the substrate 1 where no heat absorbing surface 5 is disposed. That is, the evaporating conduits 6 have a linear distance to the heat absorbing surface 5 smaller than the condensing conduits 7. Each of the evaporating conduits 6 includes a vapor outlet 61 and a liquid inlet 62. Each of the condensing conduits 7 includes a vapor inlet 71 and a liquid outlet 72. A vapor manifold 8 is intercommunicated with the vapor outlet 61 and the vapor inlet 71. A liquid manifold 9 is intercommunicated with the liquid inlet 62 and the liquid outlet 72. Specifically, the vapor manifold 8 includes a lower vapor manifold 81, a vapor transfer tube 82 and an upper vapor manifold 83. The vapor outlet 61 of each of the evaporating conduits 6 is intercommunicated with the lower vapor manifold 81, the vapor inlet 71 of each of the condensing conduits 7 is intercommunicated with the upper vapor manifold 83, and the lower vapor manifold 81 is intercommunicated with the upper vapor manifold 83 through the vapor transfer tube 82. The liquid manifold 9 includes a lower liquid manifold 91, a liquid transfer tube 92, and an upper liquid manifold 93. The liquid inlet 62 of each of the evaporating conduits 6 is intercommunicated with the lower liquid manifold 91, the liquid outlet 72 of each of the condensing conduits 7 is intercommunicated with the upper liquid manifold 93, and the lower liquid manifold 91 is intercommunicated with the upper liquid manifold 93 through the liquid transfer tube 92.

The liquid or vapor entering and exiting the inlet and outlet of each of the evaporating conduits 6 and each of the condensing conduits 7 is transferred after being converged, so that the heat dissipation is more even thereby promoting the phase transition circulation.

In order to realize the phase transition circulation of the liquid by using the effect of the gravity, preferably along the upward direction along the line of gravitational effect, the lower vapor manifold 81 is higher than the lower liquid manifold 91, i.e., the vapor outlet 61 is higher than the liquid inlet 62; the upper vapor manifold 83 is higher than the upper liquid manifold 93, i.e., the vapor inlet 71 is higher than the liquid outlet 72; the lower vapor manifold 81 not exceeds over the upper vapor manifold 83, i.e., the vapor outlet 61 is not higher than the vapor inlet 71; and the lower liquid manifold 91 is not higher than the upper liquid manifold 93, i.e., the liquid inlet 62 is not higher than the liquid outlet 72.

In this embodiment, the liquid is firstly evaporated in the evaporating conduits 6 by absorbing heat. Since the vapor outlet 61 is higher than the liquid inlet 62 along the gravitational direction, the vapor of small density flows from the vapor outlet 61 into the lower vapor manifold 81, and then enters the upper vapor manifold 83 through the vapor transfer tube 82, thereafter flows into each of the condensing conduits 7. The condensing conduits 7 are formed outside the substrate 1 and easier to dissipate heat, in which the vapor is condensed into liquid. Since the vapor inlet 71 is higher than the liquid outlet 72, the liquid flows from the liquid outlet 72 into the upper liquid manifold 93 under the effect of gravity, and then enters the lower liquid manifold 91 along the liquid transfer tube 92, thereafter flows into each of the evaporating conduits 6 through the liquid inlet 62.

In the technical solution according to this embodiment, the evaporating conduits 6 are formed inside the substrate 1, and have a small thermal contact resistance with the heat absorbing surface 5 disposed on the surface of the substrate 1, thereby being easy to absorb heat. After absorbing the heat, the evaporating conduits 6 can quickly conduct heat into the condensing conduits 7 through a phase transition circulation of the liquid. Thus, the heat conduction diffusion at the heat absorbing surface 5 can be fulfilled with small thermal resistance and a high speed, which is conducive to firstly conducting and diffusing the locally concentrated heat to a larger range where the locally concentrated heat is dispersedly dissipated. The above process can achieve a high thermal conductivity and a good heat dissipation effect.

In this embodiment, the vapor manifold 8 and the liquid manifold 9 are intercommunicated with the evaporating conduits 6 and the condensing conduits 7. In addition, along the gravitational direction, the inlets and outlets of the vapor and liquid are disposed with a certain position relationships. Thus, vapor rising and liquid dropping can be realized under the effect of gravity, and thus the phase transition circulation of the liquid is achieved and the heat conduction and diffusion are completed, and the capillary structures for guiding the liquid flow are omitted. As a result, the raw material cost can be saved and the process difficulty can be decreased. Meanwhile, the liquid forms a unidirectional and independent circulation path in the conduits, which can avoid the conflict between vapor and liquid due to a bidirectional transfer of vapor and liquid in the conduits and avoid the heat conduction efficiency from being influenced, thereby being conducive to the improvement of the heat dissipation effect.

In addition, the substrate in this embodiment is hollow and the weight thereof can be reduced. The evaporating conduits 6 being formed inside the substrate 1 can improve the heat dissipation efficiency while preventing additionally increasing the volume of the heat dissipation device. When the evaporating conduits 6 are formed inside the substrate 1, more outer space may be available for disposing the condensing conduits 7 to more easily dissipate the heat, in case there is a limitation of conditions such as dimensions of the communication device.

In this embodiment, the connection relations between the evaporating conduits 6, the condensing conduits 7, the vapor manifold 8 and the liquid manifold 9, the numbers of respective conduits, the setting states of respective conduits and their positional relationships in relation to the substrate 1 all can be designed upon the specific conditions.

The connection relationships between the respective conduits and the numbers thereof are as follows in this embodiment: the evaporating conduits 6 and the condensing conduits 7 are formed individually, i.e., they can be manufactured individually and then assembled together, and the number of the evaporating conduits 6 and the number of condensing conduits 7 are both more than 1. The numbers of the vapor manifolds 8 and the numbers of liquid manifolds 9 are less than that of the evaporating conduits 6 or that of the condensing conduits 7, respectively. As illustrated in FIG. 6, preferably, there are multiple evaporating conduits 6 and multiple condensing conduits 7, while there are only one independent vapor manifold 8 and one independent liquid manifold 9 intercommunicated with the corresponding evaporating conduits 6 and the condensing conduits 7, respectively.

During the assembly, the individually opened multiple evaporating conduits 6 and condensing conduits 7 are intercommunicated with each other through one vapor manifold 8 and one liquid manifold 9, respectively, so that the positions of the conduits can be set in a more flexible way. The evaporating conduits 6 and the condensing conduits 7 may be formed in place, respectively, and intercommunicated with each other through only a few manifolds, so as to avoid causing the increase of the complexity in product structure and the material cost. The single vapor manifold 8 and the single liquid manifold 9 can satisfy the demand of liquid circulation quantity under a certain heat dissipation capacity once they meet a certain diameter requirement.

The positional relationships of respective conduits in relation to the substrate 1 are as follows in this embodiment: the condensing conduits 7 are formed outside the substrate 1 to achieve good heat dissipation. In addition, when they are individually formed, particularly when the condensing conduits 7 are formed on the outer side of the substrate 1, the size of the condensing conduits 7 can be flexibly increased to expand the heat dissipation area.

Figure 8:
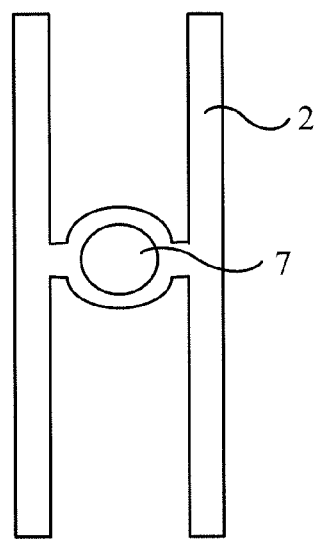
FIG. 8 is a cross-section schematic view of a condensing conduit and its heat dissipation fins according to a third embodiment of the present disclosure.
Figure 9:
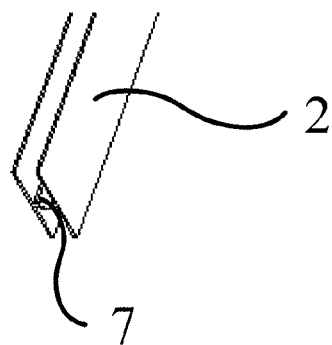
FIG. 9 is an axial side schematic structure view of the condensing conduit and the heat dissipation fins as illustrated in FIG. 8.
Figure 10:
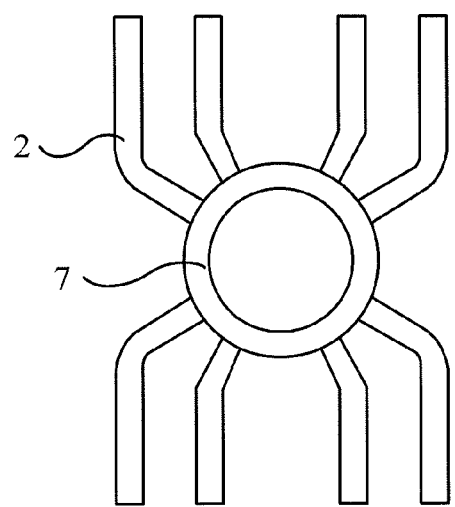
FIG. 10 is a cross-section schematic view of another condensing conduit and its heat dissipation fins according to a third embodiment of the present disclosure.

As illustrated in FIGS. 5 and 6, the condensing conduits 7 in this embodiment are formed outside the substrate 1, and an outer side of a wall of each of the condensing conduits 7 is connected with heat dissipation fins 2 to further expand the heat dissipation surface area. Preferably, each of the condensing conduits 7 can be integrally formed with the connected heat dissipation fins 2 through a process such as extrusion, and the condensing conduit 7 is a hollow conduit inside the heat dissipation fins 2. FIG. 8 is a cross-section schematic diagram of a condensing conduit 7 and its heat dissipation fins 2 according to the third embodiment of the present disclosure, and FIG. 9 is an axial side structure schematic diagram of the condensing conduit 7 and the heat dissipation fins 2 as illustrated in FIG. 8. Each of the condensing conduits 7 is sandwiched between two parallel heat dissipation fins 2, so as to effectively conduct the heat to the heat dissipation fins 2 and diffuse the heat outward. Alternatively, two or more heat dissipation fins 2 may be formed in a radial pattern by taking the condensing conduit 7 as an axis. FIG. 10 is a cross-section schematic diagram of another condensing conduit 7 and its heat dissipation fins 2 according to the third embodiment of the present disclosure. As illustrated in FIG. 10, eight heat dissipation fins 2 are formed in a radial pattern by taking the condensing conduit 7 as an axis.

The positional relations between the heat dissipation fins 2 and the condensing conduit 7 are not limited by FIGS. 9 and 10, and many other connection relations may also be used, e.g., four or six heat dissipation fins 2 are used, provided that it is beneficial to making the condensing conduit 7 contact the heat dissipation fins 2 enough, reducing the thermal spreading resistance to the heat dissipation fins 2, and increasing the heat dissipation surface area of the heat dissipation fins 2.

In order to sufficiently utilize the space occupied by the heat dissipation device, in this embodiment, preferably, the condensing conduit 7 is set to be longer than the evaporating conduit 6, and along the gravitational direction, the vapor inlet 71 is higher than the vapor outlet 61, and the liquid inlet 62 is flush with the liquid outlet 72. That is, a lower half of the condensing conduit 7 coincides with the position of the evaporating conduit 6, and the condensing conduit 7 can be connected to the surface of the substrate 1, so as to further dissipate heat through the heat dissipation fins 2.

About the setting states of respective conduits, preferably along the gravitational direction, the evaporating conduit 6 and/or the condensing conduit 7 are vertically opened; the vapor outlet 61 and the liquid inlet 62 are formed at two ends of the evaporating conduit 6, respectively; and the vapor inlet 71 and the liquid outlet 72 are formed at two ends of the condensing conduit 7, respectively.

The above solution is easier to realize the phase transition circulation of the liquid by means of the gravity. In this embodiment, both the evaporating conduit 6 and the condensing conduit 7 are vertically formed to avoid resistances to the liquid and vapor circulation caused by the conduit bending, and this can sufficiently utilize the effect of gravity and promote the circulation. In actual applications, the respective conduits may be formed at a certain inclined angle according to the shape of the substrate 1 and the designed position of the heat absorbing surface 5, and the inlets and outlets of the liquid and vapor may also be disposed at different positions of the conduits, provided that the above relative positional relations are satisfied.

About the setting positions of the manifolds, the individually formed evaporating conduits 6 and condensing conduits 7 are communicated through the vapor manifold 8 and the liquid manifold 9, which may be formed inside or outside the substrate 1. In this embodiment, specifically, the vapor manifold 8 is formed outside the substrate 1 and attached to the heat dissipation fins 2, and the liquid manifold 9 is formed outside the substrate 1.

The vapor manifold 8, formed outside the substrate 1, being attached to the heat dissipation fins 2 enables the vapor circulation to be more smoothly, and a probability of liquid occurred in the vapor manifold 8 is decreased. The liquid manifold 9 formed outside the substrate 1 can realize heat dissipation at the outside with low temperature.

In this embodiment, the operation process of the heat dissipation device is as follows: the liquid in the evaporating conduits 6 inside the substrate 1 is evaporated by absorbing heat to form vapor, the vapor in each of the evaporating conduits 6 flows out of the vapor outlet 61 and converges into the vapor manifold 8, then rises along the vapor manifold 8 and enters each of the condensing conduits 7 through the vapor inlet 71; and the vapor, after being cooled, is condensed into liquid in the condensing conduits 7, the liquid firstly converges into the liquid manifold 9 through the liquid outlet 72 under the effect of the gravity, then flows back along the liquid manifold 9, and enters each of the evaporating conduits 6 through the liquid inlet 62 to complement liquid in the evaporating conduits 6, thereby completing the circulation.

The circulation has the characteristics of a unidirectional loop, and there is no crossed reverse flow of the vapor and liquid, thus the heat exchange performance is largely improved relative to the vapor and liquid bidirectional reverse flow mode of the heat pipe, and the heat dissipation effect is enhanced. In addition, the inside of the substrate 1 is a cavity for accommodating the evaporating conduits 6, thus the weight of the whole heat dissipation device is reduced.

The Fourth Embodiment

Figure 11:
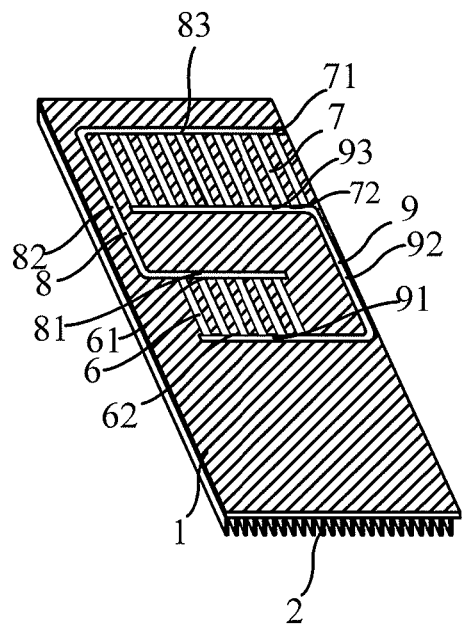
FIG. 11 is a section view of a structure of a heat dissipation device according to a fourth embodiment of the present disclosure.
Figure 12:
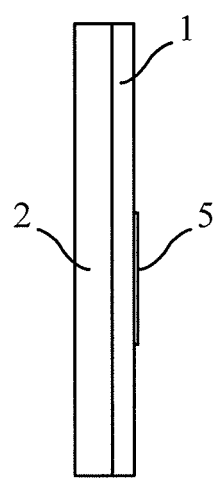
FIG. 12 is a side view of a structure of the heat dissipation device as illustrated in FIG. 11.

FIG. 11 is a section view of a structure of a heat dissipation device according to a fourth embodiment of the present disclosure, and FIG. 12 is a side view of a structure of the heat dissipation device as illustrated in FIG. 11. This embodiment differs from the third embodiment in that the condensing conduits 7 are formed inside the substrate 1.

Similar to the third embodiment, multiple evaporating conduits 6 and multiple condensing conduits 7 are individually formed side by side and in parallel, respectively. In addition, both the evaporating conduits 6 and the condensing conduits 7 are vertically formed along the gravitational direction, and the condensing conduits 7 are formed above the evaporating conduits 6. The vapor outlet 61 and the liquid inlet 62 are disposed at two ends of each of the evaporating conduits 6, respectively, and the vapor inlet 71 and the liquid outlet 72 are disposed at two ends of each of the condensing conduits 7, respectively. Along the gravitational direction, the vapor outlet 61 of each of the evaporating conduits 6 at an upper end thereof is intercommunicated with a lower vapor manifold 81 of a vapor manifold 8, the lower vapor manifold 81 is intercommunicated with a vapor transfer tube 82 bent upward, and the vapor transfer tube 82 is intercommunicated with an upper vapor manifold 83 that is intercommunicated with the vapor inlet 71 of each of the condensing conduits 7 at an upper end thereof. The liquid outlet 72 of each of the condensing conduits 7 at a lower end thereof is intercommunicated with an upper liquid manifold 93 of a liquid manifold 9, the upper liquid manifold 93 is intercommunicated with a liquid transfer tube 92 bent downward, the liquid transfer tube 92 is intercommunicated with an lower liquid manifold 91, and the liquid inlet 62 of each of the evaporating conduits 6 at a lower end thereof is intercommunicated with the lower liquid manifold 91.

In this embodiment, since the condensing conduits 7 and the evaporating conduits 6 are both formed inside the substrate 1, and preferably the positions of the two types of conduits not coincide with each other, so that the condensing conduits 7 are far away from the heat absorbing surface 5 adjacent to the evaporating conduits 6, the condensing conduits 7 can be specifically opened above the evaporating conduits 6, i.e., the liquid outlet 72 is also higher than the liquid inlet 62, and they are intercommunicated with each other through the liquid manifold 9.

The positional relationships between the evaporating conduits 6 and the condensing conduits 7 can be designed according to the specific disposed position of the heat absorbing surface 5. When the phase transition circulation of the liquid needs to be promoted by the effect of the gravity, the positional relationships can be designed provided that the relative positional relations between the inlets and outlets of the vapor and liquid satisfy the above requirement.

In the above technical solution, the evaporating conduits 6 and the condensing conduits 7 are both formed inside the substrate 1, and preferably may be channels integrally formed on the substrate 1 through a process such as die-casting or extrusion. This can save the raw materials and procedures, and further reduce the volume of the heat dissipation device.

Based on the technical solution of this embodiment, the heat dissipation fins 2 may be formed on a surface of the substrate 1 other than the heat absorbing surface 5, so as to expand the heat dissipation surface area, and improve the heat dissipation effect. The heat dissipation fins 2 may be selectively disposed adjacent to the condensing conduits 7.

The Fifth Embodiment

Figure 13:
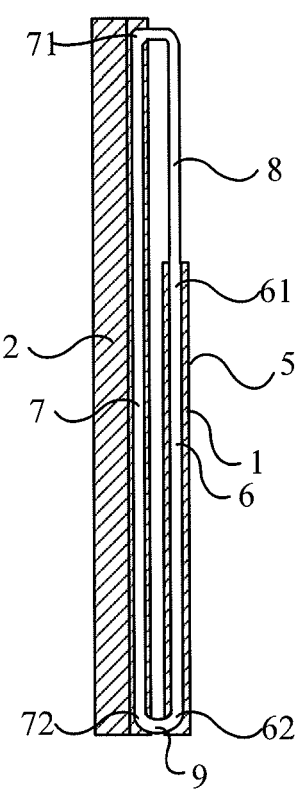
FIG. 13 is a side-sectional schematic structure view of a heat dissipation device according to a fifth embodiment of the present disclosure.

FIG. 13 is a side-sectional schematic structure view of a heat dissipation device according to a fifth embodiment of the present disclosure. This embodiment is distinct from the above embodiments in that the evaporating conduits 6 and the condensing conduits 7 are integrally formed. The vapor manifold 8 and the liquid manifold 9 are manifolds intercommunicated with the evaporating conduits 6 and the condensing conduits 7. That is, the evaporating conduits 6, the condensing conduits 7, the vapor manifold 8 and the liquid manifold 9 form a loop piping, which may be a single one. However, preferably, multiple loop pipings in parallel may be opened or multiple loop pipings may be opened upon the heat dissipation demand.

In this embodiment, the condensing conduits 7 are formed outside the substrate 1, and then may be connected with the heat dissipation fins 2 as described in the third embodiment to expand the heat dissipation surface area.

In the technical solution of this embodiment, each loop piping independently forms a circulated heat dissipation system, and this can increase the flexibility of setting, and reduce the influence on all the conduits due to local damage or blockage.

The Sixth Embodiment

Figure 14:
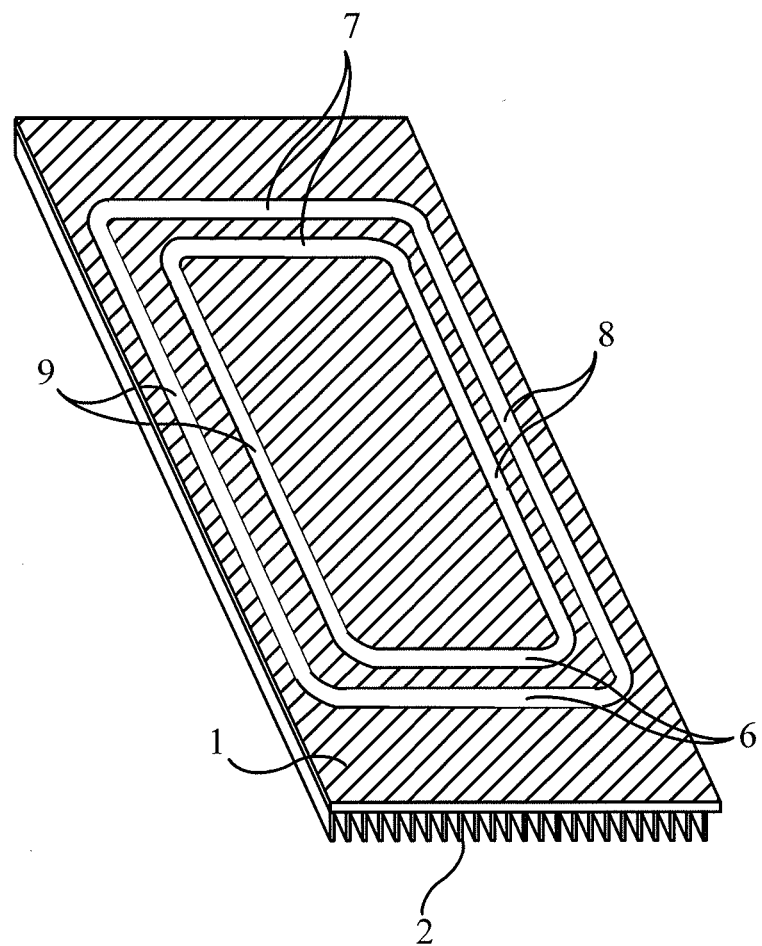
FIG. 14 is a sectional schematic structure view of a heat dissipation device according to a sixth embodiment of the present disclosure.
Figure 15:
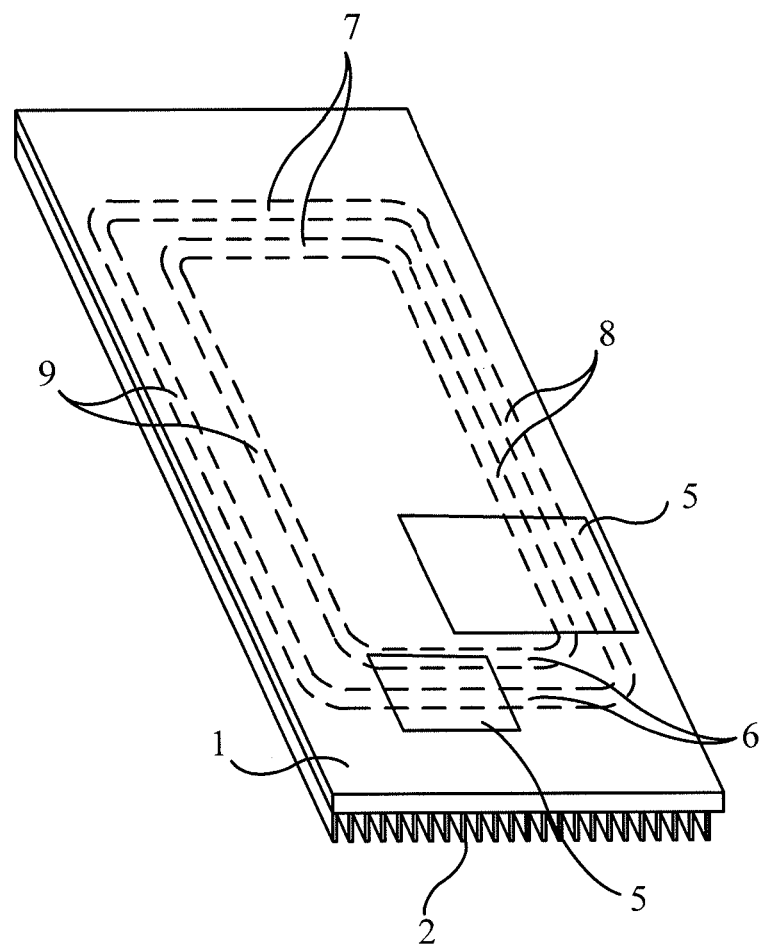
FIG. 15 is a perspective view of the heat dissipation device illustrated in FIG. 14.

FIG. 14 is a sectional schematic structure view of a heat dissipation device according to a sixth embodiment of the present disclosure, and FIG. 15 is a perspective view of the heat dissipation device as illustrated in FIG. 14. This embodiment is distinct from the fifth embodiment in that the condensing conduits 7 are formed inside the substrate 1, and a distance between the liquid manifold 9 and the heat absorbing surface 5 is larger than that between the vapor manifold 8 and the heat absorbing surface 5.

In this embodiment, the evaporating conduits 6 and the condensing conduits 7 form a loop piping. In the loop piping, in a plane parallel to the surface of the substrate 1, the portions capable of evaporation and with a smaller distance from the heat absorbing faces 5 serve as the evaporating conduits 6. The portions capable of vapor condensation and with a larger distance from the heat absorbing faces 5 serve as the condensing conduits 7. The conduit for vapor transfer serves as the vapor manifold 8. The conduit for liquid transfer serves as the liquid manifold 9. Each conduit has a different heat absorption capacity due to a different distance to the heat absorbing surface 5, so different phenomena occur in various conduits.

In this embodiment, the distance between the liquid manifold 9 and the heat absorbing surface 5 is larger than that between the vapor manifold 8 and the heat absorbing surface 5. Since the heat absorbing surface 5 is disposed asymmetrically with respect to the respective portions of the loop piping, the loop piping may have portions for evaporation by heat absorption and portions for condensation by heat dissipation. In addition, the distance between the conduit transferring liquid and the heat absorbing surface 5 is different from that between the conduit transferring vapor and the heat absorbing surface 5, there is a heat transfer direction, so that the liquid undergoes the phase transition in the loop piping is capable of realizing a circulation.

In this embodiment, the loop piping formed by the evaporating conduits 6, the condensing conduits 7, the vapor manifold 8 and the liquid manifold 9 can be formed inside the substrate 1. In addition, the evaporating conduits 6 and/or the vapor manifold 8 are adjacent to the heat absorbing surface 5, while the condensing conduits 7 and the liquid manifold 9 are far away from the heat absorbing surface 5. Moreover, the heat dissipation fins 2 may also be disposed on the surface of the substrate 1 for increasing the heat dissipation surface area.

In specific applications, the axis of the loop piping is not limited to be rectangular, but also may be circular, elliptical, quadrilateral, etc. The portions of the loop piping are not strictly divided into the evaporating conduits 6, the condensing conduits 7, the vapor manifold 8 and the liquid manifold 9. Any portion adjacent to the heat absorbing surface 5 and completing evaporation by heat absorption can be regarded as the evaporating conduits 6, and any portion far away from the heat absorbing surface 5 and completing condensation by heat dissipation can be regarded as the condensing conduits 7. Within the loop piping, the unidirectional circulation of vapor and liquid can be performed, and the bidirectional circulation of vapor and liquid can also be carried out in a same segment of conduit, and therefore the circulated heat dissipation is completed by combining the two work modes.

The loop piping formed inside the substrate 1 improves the heat dissipation effect without increasing the volume of the heat dissipation device.

In specific applications, the integrally formed evaporating conduits 6 and condensing conduits 7 may also be linear conduits opened inside the substrate 1 without being communicated through the manifolds.

Figure 16:
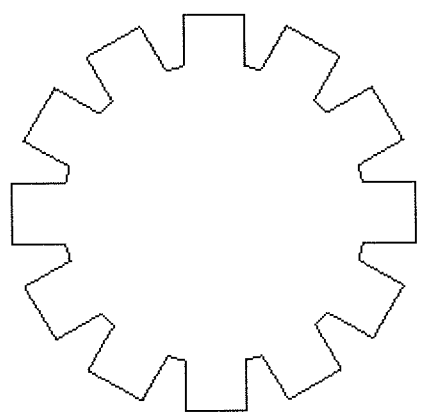
FIG. 16 is a cross-section schematic structure view of an evaporating conduit according to one embodiment of the present disclosure.

In the above first to sixth embodiments, the cross-section of the evaporating conduits 6 may be circular, rectangular, etc. Preferably, as illustrated in FIG. 16, the cross-section of the evaporating conduit 6 is set in a shape of gear, and each tooth of the gear is in a shape of trapezoid or rectangular recess, and there may be a certain interval between the teeth. The recess structure may enhance the liquid boiling vaporization.

In the technical solution of each embodiment of the present disclosure, the substrate 1, the evaporating conduits 6, the condensing conduits 7, the vapor manifold 8, the liquid manifold 9 and/or the heat dissipation fins 2 may be made of aluminum, magnesium or copper. The liquid may be ammonia, water or acetone. Since the substrate 1, the evaporating conduits 6, the condensing conduits 7, the vapor manifold 8 and the liquid manifold 9 are made of the same material, they can be integrally formed through die casting or extrusion. This can save the materials and procedures, and reduce the product cost. The liquid being selected as ammonia, water or acetone is more suitable to circulate in the conduits.

The Seventh Embodiment

The structure of a RF module with the heat dissipation device according to the seventh embodiment of the present disclosure is illustrated in FIGS. 5 to 7. The RF module according to this embodiment includes a substrate 1 having a surface thereof formed with a heat absorbing surface 5 to which functional modules of the RF modules are attached. The functional modules of each RF module may be fastened with an outer cover 3, so as to form a sealed cavity between the outer cover 3 and the substrate 1 to accommodate and protect the functional modules of the RF module. The heat dissipation device in the RF module further includes evaporating conduits 6 and condensing conduits 7. The evaporating conduits 6 are multiple hollow conduits formed inside the substrate 1. The condensing conduits 7 are intercommunicated with the evaporating conduits 6 to form sealed conduits filled with liquid which vaporizes upon heating. Among the sealed conduits, the liquid in the evaporating conduits 6 is vaporized by absorbing heat dissipated by the functional modules of the RF module from the heat absorbing surface 5 to form vapor. The vapor formed by vaporizing is transferred to the condensing conduits 7 and condensed into liquid, which flows back to the evaporating conduits 6.

In which, the sealed conduits are brought to predetermined and desired degree of vacuum.

In this embodiment, each of the evaporating conduits 6 includes a vapor outlet 61 and a liquid inlet 62. Each of the condensing conduits 7 includes a vapor inlet 71 and a liquid outlet 72. A vapor manifold 8 is intercommunicated with the vapor outlet 61 and the vapor inlet 71. A liquid manifold 9 is intercommunicated with the liquid inlet 62 and the liquid outlet 72. A unidirectional circulation of the phase transition may be formed by the manifolds.

Preferably, the vapor manifold 8 includes a lower vapor manifold 81, a vapor transfer tube 82 and an upper vapor manifold 83. The vapor outlet 61 of each of the evaporating conduits 6 is intercommunicated with the lower vapor manifold 81, the vapor inlet 71 of each of the condensing conduits 7 is intercommunicated with the upper vapor manifold 83, and the lower vapor manifold 81 is intercommunicated with the upper vapor manifold 83 through the vapor transfer tube 82. The liquid manifold 9 includes a lower liquid manifold 91, a liquid transfer tube 92, and an upper liquid manifold 93. The liquid inlet 62 of each of the evaporating conduits 6 is intercommunicated with the lower liquid manifold 91, the liquid outlet 72 of each of the condensing conduits 7 is intercommunicated with the upper liquid manifold 93, and the lower liquid manifold 91 is intercommunicated with the upper liquid manifold 93 through the liquid transfer tube 92.

Through the above connection means, the vapor formed by vaporization upon heating in multiple evaporating conduits 6 converges into the lower vapor manifold 81 through the vapor outlet 61, then flows into the upper vapor manifold 83 through the vapor transfer tube 82, and enters the condensing conduits 7 through the vapor inlet 71 so as to be condensed into liquid. The liquid flows through the upper liquid manifold 93, then the liquid transfer tube 92, and finally enters the lower liquid manifold 91. In this way, the heat dissipation in the substrate 1 is more uniform.

Along an upward direction along the line of gravitational effect, preferably, the lower vapor manifold 81 is set to be higher than the lower liquid manifold 91, the upper vapor manifold 83 is higher than the upper liquid manifold 93, the lower vapor manifold 81 not exceeds over the upper vapor manifold 83, and the lower liquid manifold 91 is not higher than the upper liquid manifold 93. Thus, a unidirectional circulation of the liquid phase transition can be completed by means of the gravity in the conduits.

In this embodiment, preferably, the condensing conduits 7 are formed outside the substrate 1 for the convenience of temperature reduction and heat dissipation. An outer side of a wall of each of the condensing conduits 7 is connected with heat dissipation fins 2, and the condensing conduits 7 and the heat dissipation fins 2 are preferably integrally formed, so as to expand the heat dissipation surface area.

In order to meet the miniaturization development tendency of the communication device such as the RF module, the area and space occupied by a general heat dissipation device shall be adapted to the volume occupied by the functional modules of the RF module so far as possible. That is, the area of the substrate 1 shall be minimized while the functional modules of all the RF modules can be attached to the substrate 1. By using the heat dissipation device according to the embodiment of the present disclosure, since the condensing conduits 7 with the heat dissipation fins 2 and the evaporating conduits 6 are individually disposed, their relative positional relations can be flexibly adjusted upon the requirements of the RF module.

In the technical solution of this embodiment, unidirectional loops of vapor and liquid are formed in the evaporating conduits 6 and the condensing conduits 7, and this improves the heat dissipation efficiency of the whole RF module while reducing the total weight. In addition, the arrangement of the conduits will not influence the cavity where the functional modules of the RF module are located, and then will not destroy the tightness of the cavity.

The Eighth Embodiment

Figure 17:
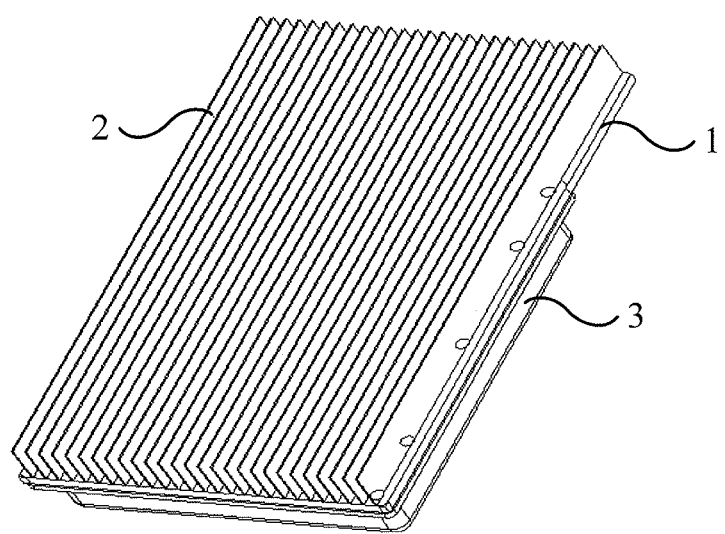
FIG. 17 is a schematic structure view of a radio frequency module with a heat dissipation device according to an eighth embodiment of the present disclosure.

FIG. 17 is a schematic structure view of an RF module with a heat dissipation device according to an eighth embodiment of the present disclosure. This embodiment differs from the seventh embodiment in that the condensing conduits 7 are formed inside the substrate 1, and a distance between the liquid manifold 9 and the heat absorbing surface 5 is larger than that between the vapor manifold 8 and the heat absorbing surface 5. When the condensing conduits 7 and the evaporating conduits 6, etc. are all formed inside the substrate 1, one side of the substrate 1 may be formed with the heat absorbing surface 5 to which heating elements such as communication functional modules are attached. The communication functional modules may also be fastened with an outer cover 3 for protection. The other side of the substrate 1 may be disposed with the heat dissipation fins 2.

In the present disclosure, the RF module with the heat dissipation device specifically may be an RRU or a Radio Frequency Unit (RFU). The heat dissipation device included in the RF module is not limited to the heat dissipation devices described in the seventh and eighth embodiments, and the heat dissipation device according to any embodiment of the present disclosure may be adopted. For an RF module such as the RRU, its functional modules may specifically be a power amplification module, a duplexer module, etc. The RF module with the heat dissipation device according to the embodiment of the present disclosure can reduce the thermal contact resistance by using the evaporating conduits 6 formed inside the substrate 1, thereby achieving good effects of heat conduction and dissipation. In addition, it can reduce the weight and size of the communication device through a hollow arrangement inside the substrate 1.

Finally, it should be noted, the above embodiments are just used to describe the technical solutions of the present disclosure, rather than making limitations thereto. Although the present disclosure is described in detail with reference to the above embodiments, a person skilled in the art shall appreciate that the technical solutions recorded in the above embodiments still can be modified, or some technical features thereof can be equivalently replaced, without making the essences of corresponding technical solutions deviate from the spirit and range of the technical solutions of respective embodiments of the present disclosure.

What is claimed is:

1. A heat dissipation device, comprising:
   a substrate having a surface where a heat absorbing surface is formed, wherein a plurality of hollow conduits are opened inside the substrate, wherein the plurality of hollow conduits form evaporating conduits;
   condensing conduits communicated with the evaporating conduits, wherein the condensing conduits and the evaporating conduits form sealed conduits, and wherein the sealed conduits are filled with liquid which vaporizes upon heating;
   vapor manifolds intercommunicated with vapor outlets of the evaporating conduits and with vapor inlets of the condensing conduits;
   liquid manifolds intercommunicated with liquid inlets of the evaporating conduits and with liquid outlets of the condensing conduits, wherein the liquid manifolds and the vapor manifolds are separated from each other, wherein the vapor inlets are higher than the vapor outlets in position and the liquid inlets are lower than the liquid outlets in position along an upward direction along a line of gravitational effect, and wherein the vapor manifolds and the liquid manifolds are parallel to the line of gravitational effect.

2. The heat dissipation device according to claim 1, wherein a cross-section of the evaporating conduits has a gear shape.

3. A Radio Frequency (RF) module with a heat dissipation device, comprising:

a substrate having a surface where a heat absorbing surface is formed, wherein the heat absorbing surface has a functional module of the RF module attached thereon, wherein a plurality of hollow conduits are opened inside the substrate to form evaporating conduits;

condensing conduits communicated with the evaporating conduits, wherein the condensing conduits and the evaporating conduits form sealed conduits, and wherein the sealed conduits are filled with a liquid which vaporizes upon heating, wherein the liquid in the evaporating conduits of the sealed conduit is vaporized from the heat absorbing surface by absorbing heat dissipated from the functional module of the RF module to form vapor, and wherein the vapor is transferred to the condensing conduits and condensed into the liquid, which flows back to the evaporating conduits;

vapor manifolds intercommunicated with vapor outlets of the evaporating conduits and with vapor inlets of the condensing conduits;

liquid manifolds intercommunicated with liquid inlets of the evaporating conduits and with liquid outlets of the condensing conduits, wherein the liquid manifolds and the vapor manifolds are separated from each other, wherein the vapor inlets are higher than the vapor outlets in position and the liquid inlets are lower than the liquid outlets in position along an upward direction along a line of gravitational effect, and wherein the vapor manifolds and the liquid manifolds are parallel to the line of gravitational effect.

4. A substrate of a heat dissipation device, comprising:

a first sealed conduit in the substrate that passes a first fluid in a single direction, wherein the first fluid comprises a first vapor and a first liquid; and a second sealed conduit in the substrate that passes a second fluid in the single direction, wherein the second fluid comprises a second vapor and a second liquid, wherein the second sealed conduit is positioned within an area encircled by the first sealed conduit, wherein the first sealed conduit comprises:

a first evaporating conduit having a first liquid inlet and a first vapor outlet;

a first condensing conduit having a first vapor inlet and a first liquid outlet;

a first vapor manifold connected to the first vapor outlet of the first evaporating conduit and the first vapor inlet of the first condensing conduit, wherein the first vapor manifold is configured to pass the first vapor from the first evaporating conduit to the first condensing conduit; and a first liquid manifold connected to the first liquid outlet of the first condensing conduit and the first liquid inlet of the first evaporating conduit, wherein the first liquid manifold is configured to pass the first liquid from the first condensing conduit to the first evaporating conduit, and wherein the second sealed conduit comprises:

a second evaporating conduit having a second liquid inlet and a second vapor outlet;

a second condensing conduit having a second vapor inlet and a second liquid outlet;

a second vapor manifold connected to the second vapor outlet of the second evaporating conduit and the second vapor inlet of the second condensing conduit, wherein the second vapor manifold is configured to pass the second vapor from the second evaporating conduit to the second condensing conduit; and a second liquid manifold connected to the second liquid outlet of the second condensing conduit and the second liquid inlet of the second evaporating conduit, wherein the second liquid manifold is configured to pass the second liquid from the second condensing conduit to the second evaporating conduit.

5. The substrate according to claim 4, wherein each of the first sealed conduit and the second sealed conduit has a gear shaped cross-section.

6. The substrate according to claim 4, wherein a first side of the substrate comprises heat dissipation fins, and wherein a second side of the substrate comprises a heat absorbing face configured to absorb heat from a radio frequency (RF) module.

7. The substrate according to claim 6, wherein the heat absorbing face is positioned proximate to the first evaporating conduit and the second evaporating conduit.

8. The substrate according to claim 6, wherein the heat absorbing face is positioned proximate to the first vapor manifold and the second vapor manifold.

9. The substrate according to claim 4, wherein the first fluid and the second fluid comprise ammonia.

10. The substrate according to claim 4, wherein the first fluid and the second fluid comprise water.

11. The substrate according to claim 4, wherein the first fluid and the second fluid comprise acetone.

12. The substrate according to claim 4, wherein the first condensing conduit and the second condensing conduit comprise wick structures.

13. The substrate according to claim 4, wherein the substrate is made of aluminum.

14. The substrate according to claim 13, wherein the substrate is formed through die-casting.

15. The substrate according to claim 13, wherein the substrate is formed through extrusion.

* * * * *

UNITED STATES PATENT AND TRADEMARK OFFICE
CERTIFICATE OF CORRECTION

PATENT NO. : 8,792,240 B2
APPLICATION NO. : 13/327059
DATED : July 29, 2014
INVENTOR(S) : Taqing Feng et al.

Page 1 of 1

It is certified that error appears in the above-identified patent and that said Letters Patent is hereby corrected as shown below:

In the Claims

Column 16, Line 37, Claim 7 should read:

The substrate according to claim 6, wherein the heat absorbing face is positioned proximate to the first evaporating circuit and the second evaporating circuit.

Signed and Sealed this
Twenty-first Day of October, 2014

Michelle K. Lee
*Deputy Director of the United States Patent and Trademark Office*